US008510685B1

(12) United States Patent
Rossman et al.

(10) Patent No.: US 8,510,685 B1
(45) Date of Patent: Aug. 13, 2013

(54) METHODS, SYSTEMS, AND ARTICLES OF MANUFACTURE FOR CREATING A HIERARCHICAL OUTPUT FOR AN OPERATION IN AN ELECTRONIC DESIGN

(75) Inventors: Sabra Rossman, Bellevue, WA (US); Mark Rossman, Bellevue, WA (US)

(73) Assignee: Cadence Design Systems, Inc., San Jose, CA (US)

( * ) Notice: Subject to any disclaimer, the term of this patent is extended or adjusted under 35 U.S.C. 154(b) by 103 days.

(21) Appl. No.: 12/649,643

(22) Filed: Dec. 30, 2009

(51) Int. Cl.
 *G06F 17/50* (2006.01)
(52) U.S. Cl.
 USPC ............... 716/55; 716/50; 716/51; 716/52; 716/54; 716/56
(58) Field of Classification Search
 USPC ........... 716/111, 112, 50–56, 110, 139
 See application file for complete search history.

(56) References Cited

U.S. PATENT DOCUMENTS

| | | | |
|---|---|---|---|
| 6,285,783 B1 | 9/2001 | Isomura et al. | |
| 6,289,412 B1 | 9/2001 | Yuan et al. | |
| 6,370,679 B1 | 4/2002 | Chang et al. | |
| 6,446,239 B1 | 9/2002 | Markosian et al. | |
| 6,453,452 B1 | 9/2002 | Chang et al. | |
| 6,931,613 B2* | 8/2005 | Kauth et al. | 716/115 |
| 7,073,149 B2 | 7/2006 | Knol et al. | |
| 7,240,321 B2* | 7/2007 | Cobb et al. | 716/53 |
| 7,284,214 B2 | 10/2007 | LeBritton et al. | |
| 7,356,788 B2 | 4/2008 | Chang et al. | |
| 7,370,306 B2 | 5/2008 | Juengling | |
| 7,735,036 B2 | 6/2010 | Dennison et al. | |
| 7,865,857 B1 | 1/2011 | Chopra et al. | |
| 7,886,262 B2 | 2/2011 | Chew et al. | |
| 8,028,243 B1 | 9/2011 | O'Riordan | |
| 8,046,730 B1 | 10/2011 | Ferguson et al. | |
| 2003/0018948 A1* | 1/2003 | Chang et al. | 716/8 |
| 2004/0044980 A1 | 3/2004 | Juengling | |
| 2006/0090146 A1 | 4/2006 | LeBritton et al. | |
| 2006/0236299 A1* | 10/2006 | Sahouria et al. | 716/21 |
| 2006/0277520 A1 | 12/2006 | Gennari | |
| 2007/0011636 A1* | 1/2007 | Seidl et al. | 716/9 |
| 2008/0109772 A1* | 5/2008 | Pokorny | 716/5 |
| 2008/0216045 A1 | 9/2008 | Kobayashi et al. | |
| 2008/0256500 A1* | 10/2008 | Cobb et al. | 716/5 |
| 2009/0001337 A1* | 1/2009 | Furukawa et al. | 257/2 |
| 2011/0016423 A1 | 1/2011 | Brubaker | |
| 2011/0219320 A1 | 9/2011 | Majumder et al. | |

OTHER PUBLICATIONS

Non-Final Office Action dated Mar. 23, 2012 for U.S. Appl. No. 12/649,658.

(Continued)

*Primary Examiner* — Nha Nguyen
(74) *Attorney, Agent, or Firm* — Vista IP Lawgroup, LLP

(57) ABSTRACT

Disclosed are methods, systems, and articles of manufacture for processing a electronic design, which use a computer system to identify an operation associated with a task to be performed on the electronic design, to generate a hierarchical output for multiple shapes for performing the task based at least in part on performing an operation associated with the task, and to display or to store the hierarchical output. The task comprises a dummy fill insertion task or a design verification task in some embodiments. The methods or the systems may further determine or identify an inverse transform and apply the inverse transform to a shape before adding the shape to the hierarchical output. In some embodiments, there exists no duplication among the shapes in the hierarchical output, or only shapes derived from original shapes that belong to the first instance of a cellview master are added to the hierarchical output.

29 Claims, 11 Drawing Sheets

(56) References Cited

OTHER PUBLICATIONS

Non-Final Office Action dated Nov. 21, 2011 for U.S. Appl. No. 12/713,819.
Final Office Action dated May 10, 2012 for U.S. Appl. No. 12/713,819.
Final Office Action dated Aug. 29, 2012 for U.S. Appl. No. 12/649,658.
Notice of Allowance dated May 14, 2013 for U.S. Appl. No. 12/649,658.

* cited by examiner

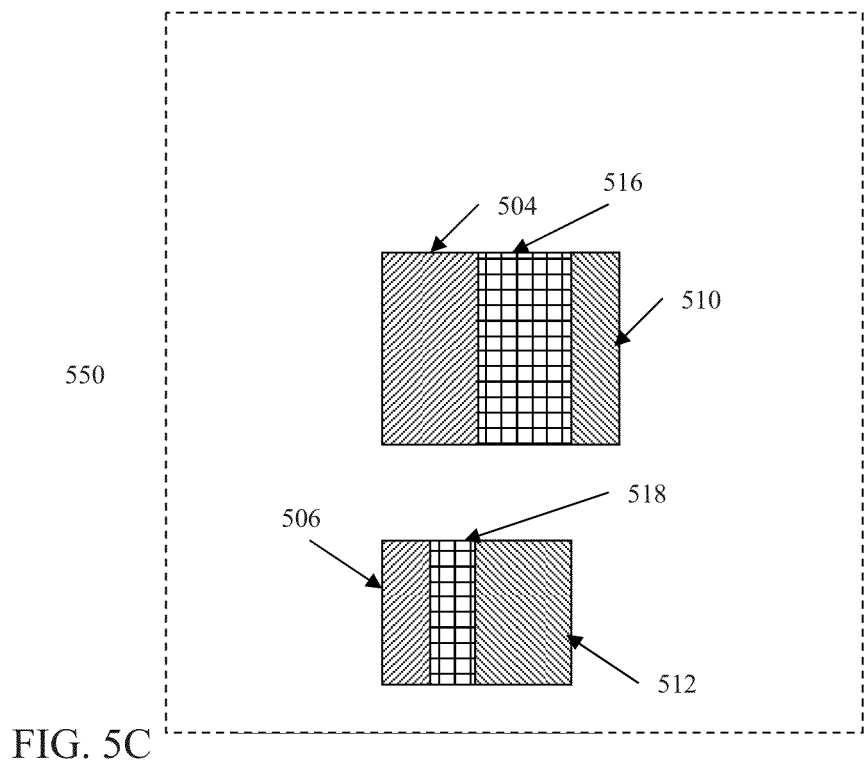
FIG. 5C
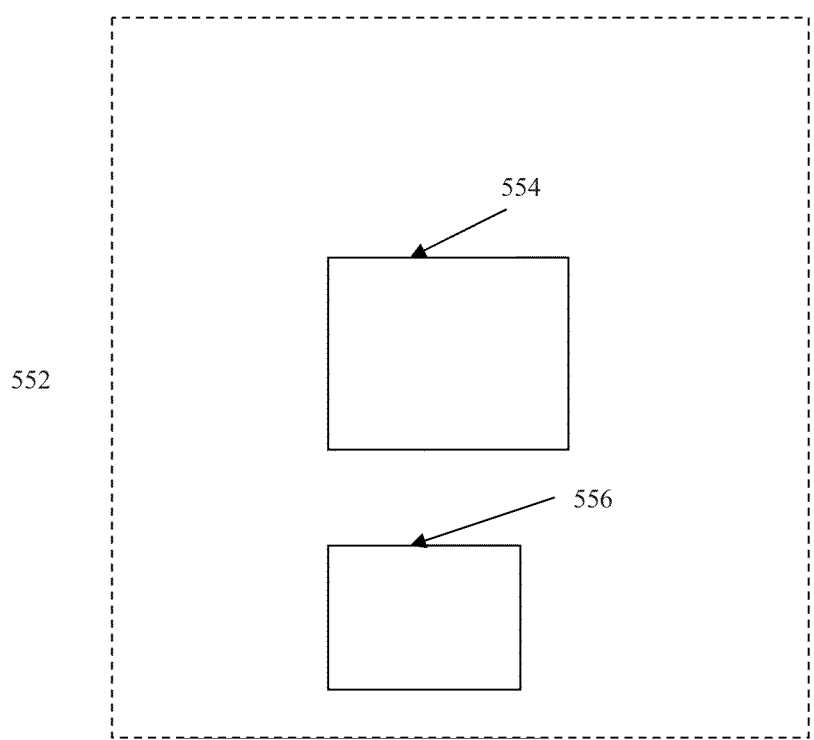

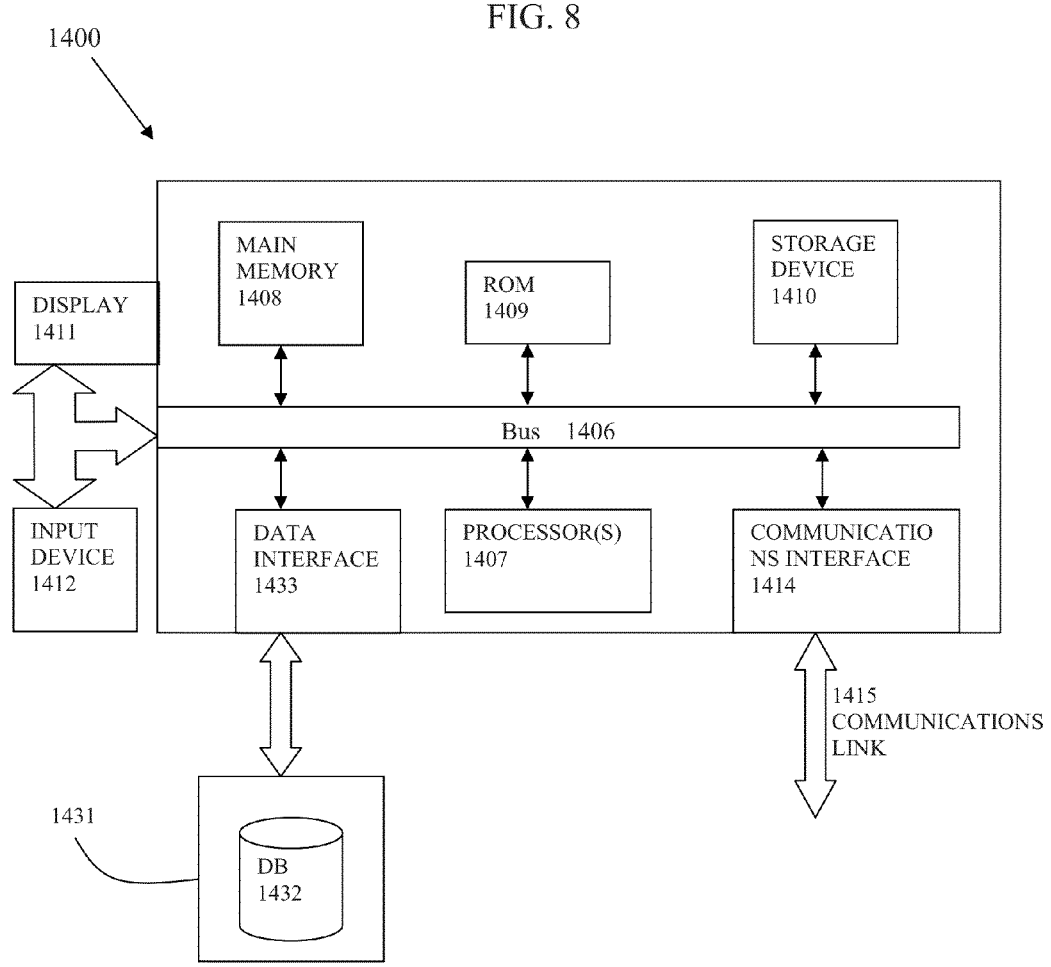

METHODS, SYSTEMS, AND ARTICLES OF MANUFACTURE FOR CREATING A HIERARCHICAL OUTPUT FOR AN OPERATION IN AN ELECTRONIC DESIGN

CROSS-REFERENCE TO RELATED APPLICATION(S)

Certain aspects in some embodiments of this Application are related to and disclosed in U.S. application Ser. No. 12/649,658, entitled "METHODS, SYSTEMS, AND ARTICLES OF MANUFACTURE FOR CREATING A HIERARCHICAL OUTPUT FOR AN OPERATION IN AN ELECTRONIC DESIGN" and was filed concurrently, the contents of which are incorporated by reference in their entirety in this Application. This Application is further cross-related to U.S. application Ser. No. 12/713,819, entitled "METHODS, SYSTEMS, AND ARTICLES OF MANUFACTURE FOR CREATING A HIERARCHICAL OUTPUT FOR AN OPERATION IN AN ELECTRONIC DESIGN" and filed on Feb. 26, 2010.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

The invention relates to technology for designing and verifying an integrated circuit ("IC") or electronic circuit design.

A semiconductor integrated circuit (IC) or an electronic circuit has a large number of electronic components, such as transistors, logic gates, diodes, wires, etc., that are fabricated by forming layers of different materials and of different geometric shapes on various regions of a silicon wafer.

Many phases of physical design may be performed with computer aided design (CAD) tools or electronic design automation (EDA) systems. To design an electronic circuit, a designer first creates high level behavior descriptions of the electronic circuit device using a high-level hardware design language. An EDA system typically receives the high level behavior descriptions of the electronic circuit device and translates this high-level design language into netlists of various levels of abstraction using a computer synthesis process. A netlist describes interconnections of nodes and components on the chip and includes information on circuit primitives such as transistors and diodes, their sizes and interconnections, for example.

An electronic circuit designer may use a set of EDA application programs to create a physical electronic circuit design layout from a logical circuit design. The EDA application uses geometric shapes of different materials to create the designs of the various electrical components in an electronic circuit and to represent electronic circuit components as geometric objects with varying shapes and sizes. Typically, geometric information about the placement of the nodes and components onto the chip is determined by a placement process and a routing process. The placement process is a process for placing electronic component design and/or circuit design blocks on the chip and the routing process is the process for creating interconnections between the blocks and components according to the specified netlist. In a typical electronic circuit design flow, routing involves assigning wires and vias to create a circuit connection.

In the Integrated Circuit (IC) design, electronic components and wiring are represented by a set of geometric shapes and patterns from a physical perspective. Electronic design automation (EDA) tools interact with these shapes and patterns throughout the IC design and verification process. The electronic circuit design then goes through various stages of verification and optimization via a set of EDA Aesting and analysis tools. Verification may include, for example, design rule checking (DRC) to verify whether or not various electronic circuit parameters comply with various design rules that are established for the respective electronic circuit parameters. For example, the patterns and shapes in the design are routinely checked with the Design Rules—Design Rules Checking (DRC). Design rules are a series of parameters provided by semiconductor manufacturers, specifying geometric and connectivity restrictions to ensure sufficient margins to account for variability in semiconductor manufacturing processes.

DRC enables a designer to verify the correctness of his or her design and to achieve a high overall yield and reliability for the design. In other words, a routing solution, for example, is usually driven by various design rules against which the electronic design may be checked and a set of requirements such as spacing requirements between two or more objects and routing object size requirements. The routing applications such as a router then ensure that these design rules and various sets of requirements are met in order to have a working electronic circuit. For example, DRC governs how an object has to be spaced relative to another object and to meet the width requirement. That is, after the physical mask layout is generated for an electronic circuit, the layout is measured by a set of constraints, rules, or requirements, such as geometric constraints or rules for the particular processes the electronic circuit is designed to perform, to ensure high yield and reliability by verifying that the electronic design meets the process constraints.

An electronic circuit often comprises a plurality of blocks or modules which are highly state-dependent because the actions of the plurality of blocks or modules depend not only on their inputs but also on what events have previously happened. The electronic circuit components, or, more precisely, the geometries in the electronic circuit design in a verification flow, such as a design rule checking process, are usually grouped into layers. Depending upon the type of verification operations, typical examples of such layers comprise drawn layers which represent the original layout data, polygon layers each of which constitutes the output of a layer creation operation such as a Boolean operation, an area function, or a polygon operation. Typical examples of such layers may also comprise edge layers, each of which represents one or more edges of merged polygons as outputted by operations such as some measurement operations. Another exemplary layer is an error layer which comprises a set of one or more edges from a measurement operation.

Such a hierarchical design for an electronic circuit defines the underlying circuit as a plurality of smaller modules, blocks, cells, or cellviews, each of which may be further broken down to comprise another set of even smaller sub-modules or sub-blocks and eventually down to individual circuit elements or components such as individual pieces of interconnects. This hierarchical nature of the electronic design allows the circuit designers not only to consider the entire electronic circuit in a modular way but also to consider each of the modules, blocks, sub-modules, sub-blocks, or the individual circuit elements individually, if desired. In addition, this hierarchical design allows for scoping for variable declaration, procedure calls, and/or policy determination for each of the various levels in the hierarchy.

Conventional approaches for verification of electronic circuits such as language-based DRC or image-based DRC operate upon a flat design. It is noted that a flat design may be considered as an electronic design with one cell in the sense that every circuit element in the electronic design belongs to the single cell. With these conventional approaches, a cell-based hierarchical input for an electronic design is flattened, and the entire design is internally represented as one large cell. The language-based DRC (such as a rule-based DRC or a model-based DRC) or an image-based DRC is then performed against this flattened design.

Compared to flat designs, hierarchical designs offer various advantages such as containing a potential state or transition explosion problem when composing sub-states, capability and relative ease in modeling complex hierarchical control flow with transitions spanning different levels of the behaviors of the electronic circuit, and the capability of multi-thread computation, all of which are known, typical problems of a flat design. In addition, a flat design has been well known to be ill suited for parallelization and multi-threaded computation.

On the other hand, the complex interactions between multiple elements which may even belong to multiple layers in the hierarchy of the electronic design have imposed an almost insurmountable barrier to performing verification of hierarchical electronic circuit designs because analyzing such a hierarchical design is known to be NPC (nondeterministic polynomial time-complete) in the size of the hierarchical design. This barrier is further exacerbated by the choice of hierarchy in a given electronic circuit design because circuit designers often determines the hierarchies based on factors or reason completely unrelated to verification. For example, a circuit designer may determine the hierarchies of an electronic circuit design based on the ease of logical understanding of the circuit functions.

In addition, insertion of metal fills or dummy fills (hereinafter, the fill structures) is a technique that is commonly used to enhance integrity and assure planarity of the deposited layers on an electronic circuit. Without the support of the fill structures, undesired topological variations, such as variation in thickness uniformity, copper dishing or erosion due to one or more patterns in the vicinity in a CMP (chemical mechanical polishing) process, etc. may occur. These variations may negatively affect the electronic circuit in terms of yield, performance, etc.

For example, without the support of the fill structures, layers may sag and thus allow conductors of different layers to get too close in violation of a spacing design rule. The fill structures may also affect the electrical operations or characteristics of the underlying circuit, in particular the capacitance between connecting conductors. The fill structures are thus inserted into the electronic design to address these issues and typically include many pieces.

The insertion of the fill structures often involves one or even multiple layers in the electronic circuit. Recent approaches for inserting the fill structures call for the insertion of appropriate fill structures on one layer to resolve potential variations that are caused by that very layer or are propagated from another layer(s). For example, a given layer in an electronic design may not be allowed to accommodate any fill structures or may not have sufficient area to accommodate enough fill structures to successfully resolve the variations. A typical approach is not to add the fill structures or sufficient fill structures into that given layer and allows the variations to propagate to the second layer(s). The typical approach then adds appropriate fill structures to the second layer(s) to address the variations on the second layer(s) as well as the variations propagated from the given layer to the second layer(s). In dealing with such tasks as inserting fill structures in multiple layers, conventional approaches generally require flattening the electronic design despite the electronic circuit design started as a hierarchical design.

Nonetheless, conventional approaches invariably utilize the geometries in the cell(s) or cellview(s) to process the Boolean operations, which are often included in, for example, the insertion of metal or dummy fill or in the language-based or image-based design rule checking, and generate the output of the Boolean operations in a flat structure and are incapable of generating the output of the Boolean operations in a hierarchical structure.

Therefore, there exists a need for a method, a system, and an article of manufacture for creating a hierarchical output for a Boolean operation which is operated upon an electronic design.

SUMMARY

Disclosed are various embodiments of methods, systems, and articles of manufactures for creating a hierarchical output for a Boolean operation which is operated upon an electronic design.

In a single embodiment or in some embodiments of the method or the system for creating a hierarchical output for a Boolean operation which is operated upon an electronic design comprise the acts or hardware modules for using one or more master output layers (MOLs), one or more master regions, one or more global scratch layers (GSLs) to create a hierarchical output for one or more Boolean operations associated with a task that is or is to be performed on the electronic circuit design. In a single embodiment or in some embodiments of the method or the system for creating a hierarchical output for a Boolean operation which is operated upon an electronic design are implemented by utilizing an inverse transform, one or more clipping and other logical operations, and a tessellation process to create the hierarchical output for the one or more Boolean operations associated with the task. More details about the methods, systems, and articles of manufactures will be described in the following paragraphs.

BRIEF DESCRIPTION OF THE FIGURES

The drawings illustrate the design and utility of preferred embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 5C illustrates an exemplary implementation of the methods or systems as disclosed in this Application.

FIG. 8 illustrates a block diagram of an illustrative computing system 1400 suitable for implementing various embodiment of the invention

DETAILED DESCRIPTION

Various embodiments of the invention are directed to a method, system, and computer program product for creating a hierarchical output for an operation which is or is to be operated upon an electronic design for the performance of a task on the electronic circuit. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of the present invention. Where certain elements of the present invention can be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, the present invention encompasses present and future known equivalents to the components referred to herein by way of illustration.

Figure 1:
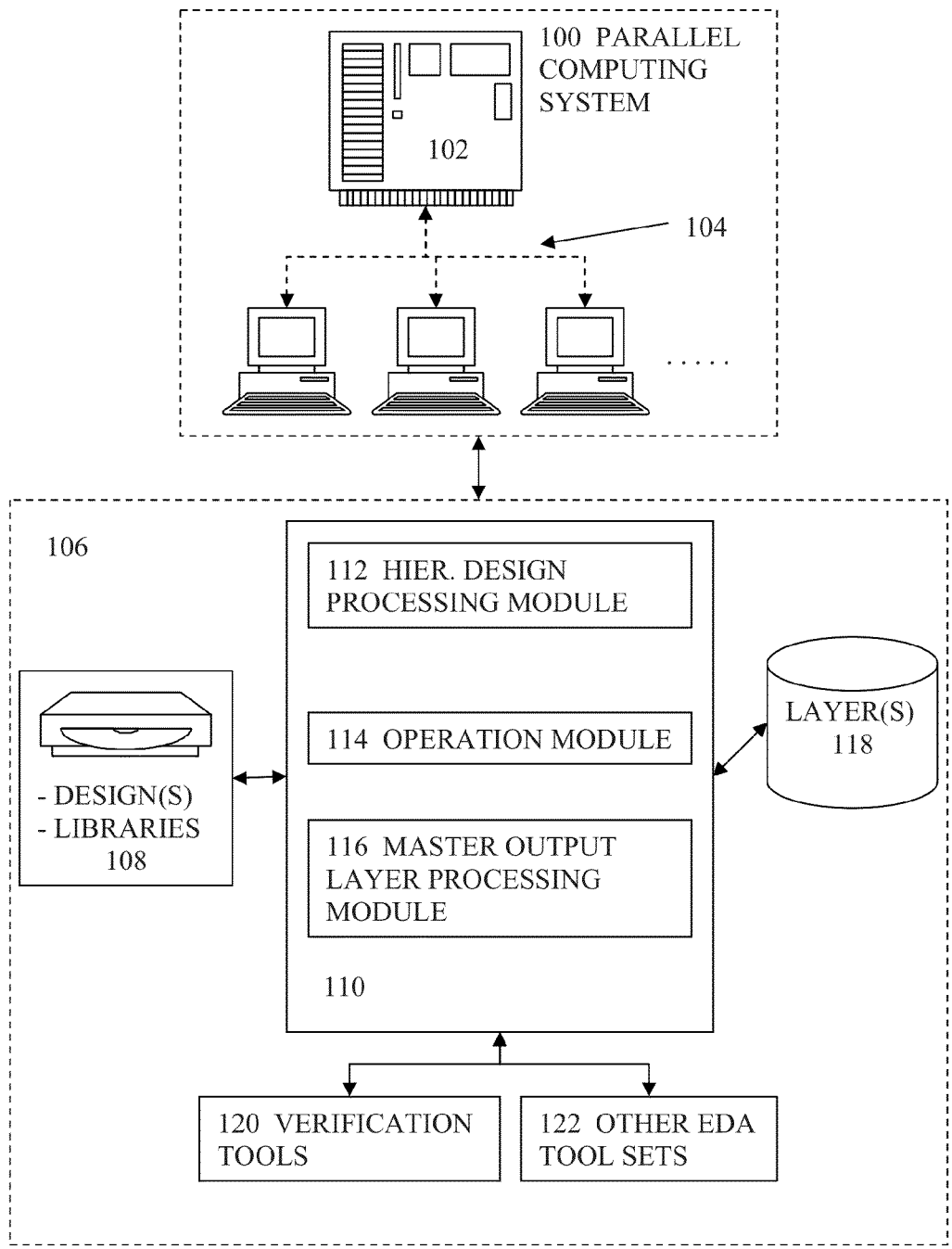
FIG. 1 illustrates an exemplary computing system for implementing the process for creating a hierarchical output for an operation which is or is to be operated upon an electronic design for the performance of a task on the electronic circuit.

With reference to FIG. 1, the computing system 100 comprises a master computing node 102 and one or more slave computing nodes 104 in some embodiments. In some embodiments, the computing system comprises a scalable multithreading parallel system with one or more central processing units (CPUs) where multiple threads share the computing resources such as the computing units, the CPU caches, and the translation lookaside buffer to achieve faster overall execution of the acts by, for example, increasing utilization of a processor core by leveraging thread-level and instruction-level parallelism. In these embodiments, the CPUs may comprise one or more processor cores, and at least one of the process cores is capable of multi-thread computation. In other embodiments, the computing system 100 may comprise a single computing system with one or more central processing unit (CPU) each of which comprises one or more processing cores, at least one of which is capable of multi-thread computation.

In the embodiments where the computing system comprises a master computing node 102 and one or more slave computing nodes 104, the master computing node is responsible for dividing the hierarchical electronic circuit design or a portion (such as a master region or a region of interest) into a plurality of sub-regions. The master computing node also spawns and initiates the one or more slave computing nodes 104. More details of dividing the electronic circuit design or a portion thereof are described in greater details in the following paragraphs.

106 of FIG. 1 illustrates an exemplary EDA (electronic design automation) tool set which comprises design contents 108 that are temporarily or permanently stored in one or more computer readable storage media, one or more computer storage devices, or a combination thereof. The design contents comprise, for example, one or more electronic circuit designs and libraries (such as design libraries, reference libraries, standard cell libraries, etc.)

The EDA tool set also comprises the processing module 110 for creating a hierarchical output for an operation in an electronic design. The hierarchical processing module 110 comprises the hierarchical design processing module 112 which will be described in greater details in subsequent paragraphs. The hierarchical processing module 110 also comprises an operation module 114 and a master output layer processing module 116, both of which will also be described in greater details in subsequent paragraphs.

The hierarchical processing module 110 is communicatively coupled to the one or more layers that are stored in one or more temporarily or permanent computer readable storage media, one or more computer storage devices, or a combination thereof (118). The hierarchical processing module 110 interacts with the one or more layers to achieve the intended purposes. More details about the interactions between the hierarchical processing module 110 and the one or more layers 118 will be described in greater details in subsequent paragraphs. The hierarchical processing module 110 also interacts with the communicatively coupled design contents 108 to, for example, read or import the hierarchical electronic circuit design (or a portion thereof) and the needed libraries either dynamically or statically.

The hierarchical processing module 110 uses the one or more layers 118 to perform various processes in 112, 114, and 116 on the computing system 100 in some embodiments. The hierarchical processing module 110 is also communicatively coupled with verification tools 120 or other EDA tool sets 122 (such as a dummy fill insertion module or a verification module) to further perform other functions such as physical verification or dummy fill insertion with the hierarchical output generated by the hierarchical processing module 110. Various tasks in 106 such as some or all of the tasks in modules 112, 114, 116, 120, and 112, may be performed on the computing system 100 as described above.

Figure 2:
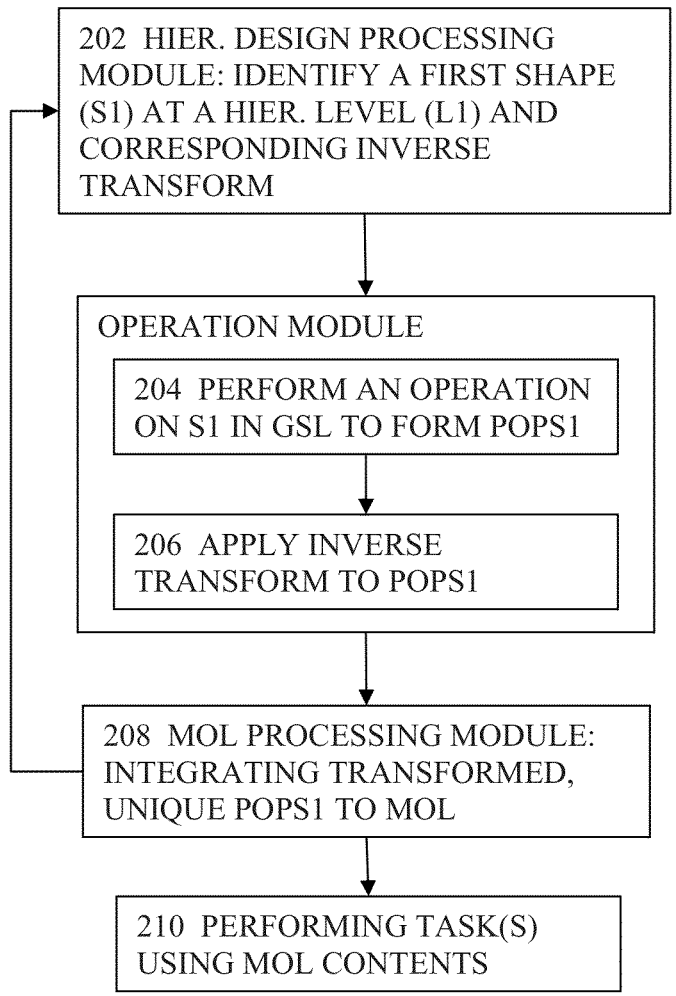
FIG. 2 illustrates a top level diagram for the methods and systems for generating a hierarchical output for an operation which is or is to be operated upon an electronic design for the performance of a task on the electronic circuit.

With reference to FIG. 2 which illustrates a top level diagram for the methods and systems for generating a hierarchical output for an operation which is or is to be operated upon an electronic design for the performance of a task on the electronic circuit, the method or the system comprises identifying a first shape instance (S1) at a first hierarchical level (L1) at 202 in some embodiments. Note that the first hierarchical level may be any hierarchical level in the hierarchy and does not necessarily correspond to the highest or the lowest level of hierarchy in the hierarchical structure of the electronic design. The methods and systems for generating a hierarchical output for an operation may further comprise identifying or determining a corresponding inverse transform for the instance path of the cellview master to which the identified shape S1 belongs at 202. In some embodiments, the inverse transform maps or transforms the identified shape instance S1 to the location it would have if its master was placed at the origin.

The following code demonstrates an exemplary inverse transform in some embodiments. The copyright owner has no objection to the facsimile reproduction by anyone of the patent document or the patent disclosure, as it appears in the Patent and Trademark Office patent file or records, but otherwise reserves all copyright rights whatsoever.

```
void
msiBoolean::getTransformForShape(ctuShape *shape,
int depth,
oaTransform &xform)
{
xform.init( )
if (depth==0) {
   return;
}
for (int i=0; i<depth; i++) {
   ctuShape *object=shape→instPath(i);
   oaTransform tmpXform;
   tmpXform.init( )
   if (object→is ArrayInstance( )
      ctuArrayInstance *aInst=object→asArrayInstance( )
      oaUInt4 r=shape→row(i);
      oaUInt4 c=shape→col(i);
      aInst→getTransform(r, c, tmpXform);
   } else {
      object→getTransform(tmpXform);
   }
   tmpXform.concat(xform);
   xform=tmpXform;
}
xform.invert( )
}
```

At 204, the methods and systems for generating a hierarchical output for an operation comprises performing an operation on the first shape instance S1 in a global scratch layer (GSL) to form a first post operation shape (POPS1) in some embodiments. For example, the methods or the systems may perform a Boolean operation such as a Boolean OR operation between the first shape instance S1 and existing shapes in the global scratch layer to form a logical disjunction among the first shape instance S1 and the existing shapes.

In these embodiments, the methods and systems for generating a hierarchical output for an operation may also identify the operation based at least in part upon one or more tasks that may utilize the hierarchical output generated by the process as described in FIG. 2. For example, the methods and systems for generating a hierarchical output for an operation may determine the type(s) of operations needed for, for example, a physical verification, dummy fill, or other tasks that may use the hierarchical output generated by the process as illustrated in FIG. 2. As a more specific example, if the methods or the systems determines that a subsequent dummy fill insertion process requires the union of all the shapes in a particular region on a specific level of the electronic circuit design, the methods or the systems may determine the operation to be a logical disjunction (logical OR) for the shapes on the specific level and then perform the various processes as described herein.

At 206, the methods and systems for generating a hierarchical output for an operation may also comprise applying the inverse transform to the first post operation shape (POPS1) to determine the location that the first post operation shape would have if it is placed in the electronic circuit design. At 208, the methods and systems for generating a hierarchical output for an operation comprises adding the inversely transformed first post operation shape instance to a master output layer (MOL). In some embodiments, the methods and systems for generating a hierarchical output for an operation may further comprise clipping the first post operation shape instance POPS1 against one or more shapes that already exist in the master output layer to ensure that the master output layer comprises unique shapes without duplication or without shape instances covering the same area of the electronic circuit design.

Once the action of adding the first post operation shape instance to the master output layer is complete, the methods and systems for generating a hierarchical output for an operation may then iteratively loop back to 202 to identify another shape and to repeat the actions at 202, 204, 206, and 208 until all the desired shapes at the desired level(s) are processed accordingly in some embodiments. At 210, the methods and systems for generating a hierarchical output for an operation may further comprise performing one or more tasks using the contents of the master output layer in some embodiments. For example, the methods and systems for generating a hierarchical output for an operation may invoke a verification EDA tool set or a dummy fill insertion tool set to respectively perform design verification and dummy fill insertion in parallel or in a distributed computing environment by using the hierarchical output generated by the methods or systems as illustrated in the preceding actions with reference to FIG. 2.

Figure 3:
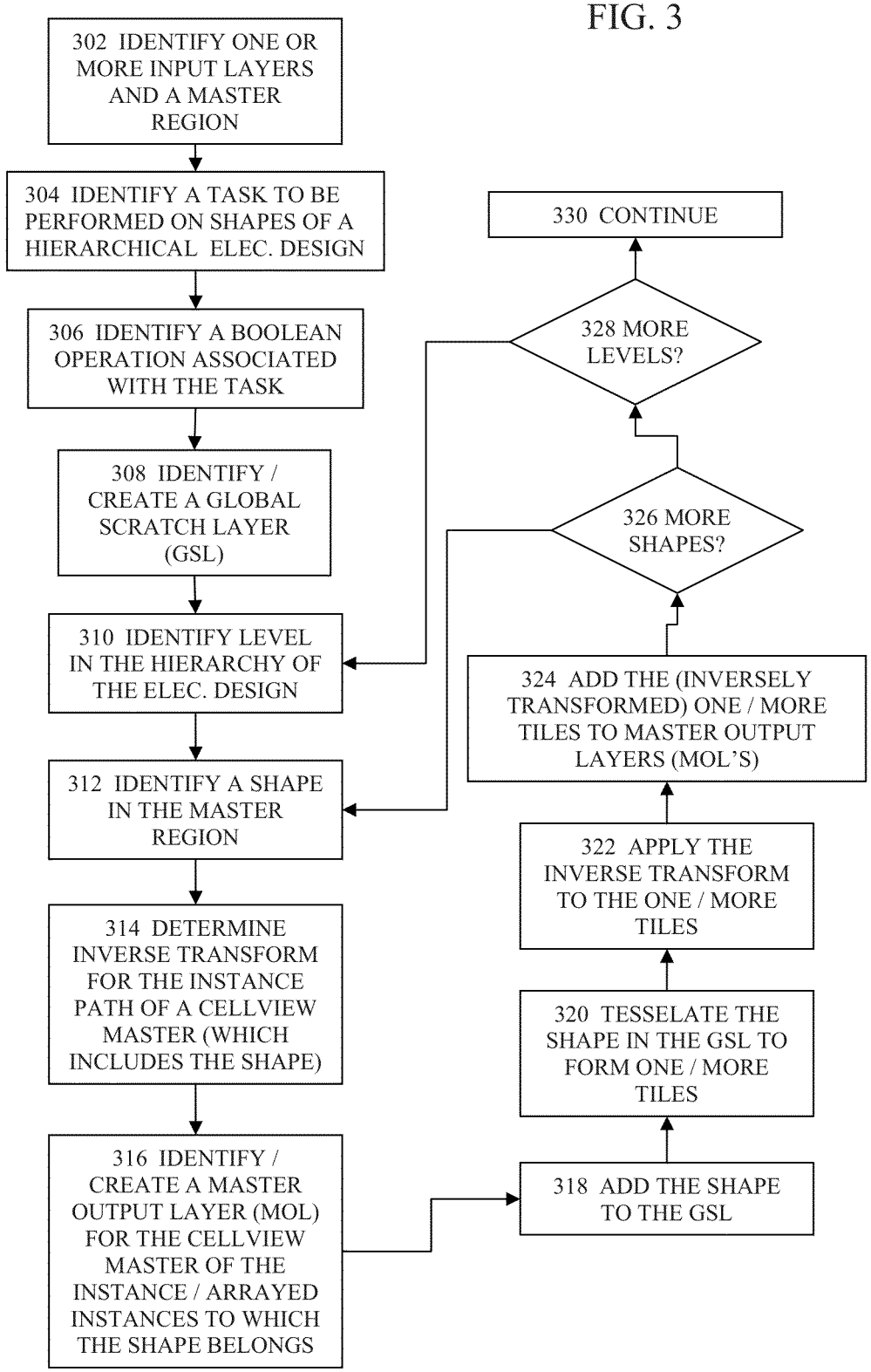
FIG. 3 illustrates a more detailed diagram for methods or systems for creating a hierarchical output for an operation associated with a task that is performed or is to be performed upon an electronic design.

Referring to FIG. 3 which illustrates a top level diagram for the methods and systems for creating a hierarchical output for an operation which is or is to be operated upon an electronic design for the performance of a task on the electronic circuit. More specifically, FIG. 3 illustrates the top level diagram for the methods and systems for creating a hierarchical output for an OR Boolean operation which is or is to be operated upon the electronic design for the performance of the task.

In a single embodiment or in some embodiments of the methods or the systems for creating a hierarchical output for a Boolean operation which is operated upon an electronic design comprise the acts or hardware modules of identifying one or more input layers or one or more master regions (302). In some embodiments, the one or more master regions represent one or more interest regions in the electronic circuit design upon which one or more tasks, such as one or more verification tasks or dummy fill or metal fill (hereinafter dummy fill) insertions, are performed. In other embodiments, the one or more master regions may represent the entire electronic circuit design. In various embodiments, the methods and systems consider the geometric, shapes, or components (hereinafter shapes) in the one or more master regions.

In the single embodiment or in some embodiments, the methods or systems further comprise the act or module for identifying a task to be performed on a plurality of shapes of the electronic circuit design (304) and one or more Boolean operations associated with the task (306). In the single embodiment or in some embodiments, the methods or systems further comprise the act or module for identifying a global scratch layer (GSL) and creating the global scratch layer if the global scratch layer is determined not to exist (308). In the single embodiment or in some embodiments, the methods or systems further comprise the act or module for identifying a level in the hierarchy of the electronic design (310). The methods or systems then consider various shapes, geometries, or components at this identified level in these embodiments. In some embodiments, the hierarchy represents the tree or a directed acyclic graph (DAG) which represents the cellview instantiation in the electronic circuit design.

In the single embodiment or in some embodiments, the methods or systems further comprise the act or module for identifying a shape at the identified level within the one or more master regions (312). The identified shape is then further processed as described in greater details below for the performance of the one or more Boolean operations (and hence the task) upon the identified shape. In the single embodiment or in some embodiments, the methods or systems further comprise the act or module for identifying or determining an inverse transform for an instance path of a cellview master to which the identified shape belongs (314).

The inverse transform is used to transform the identified shape to the location it would have if its respective cellview master with which the identified shape is associated was placed at the origin. In the single embodiment or in some embodiments, the inverse transform is identified or determined but is not yet applied to the identified shape or any derivative shapes or geometries of the identified shape at 314. In some embodiments, the instance represents the placement or instantiation of a particular cellview master in the electronic circuit design, and the cellview master refers to the portion of the design which contains the actual geometries for a particular cellview. In some embodiments, the instance path refers to the path through the hierarchy from a particular instance to the top level of the hierarchy. In these embodiments, each level in the path is defined by the instance of the cellview master instantiated at the level, and the transform for the placement of that instance of the cellview master.

In the single embodiment or in some embodiments, the methods or systems further comprise the act or module for identifying a master output layer (MOL) from the one or more output layers (MOLs) for the cellview master of the instance or arrayed instances to which the identified shape belongs (316). In the single embodiment or in some embodiments, the methods or systems further comprise adding the identified shape to the global scratch layer (GSL) for further processing.

In some embodiments, the identified shape is added to the GSL, and a clipping process is then performed upon the identified shape against one or more shapes that already exist in the GSL so as to avoid duplication to form a post-Boolean operation shape (PBOS). In these embodiments, any area in the master region that is simultaneously represented by the identified shape and also by the one or more existing shapes will be clipped from the identified shape such that no shape in the GSL will be represented by more than one cell. The clipping process may be logical or mathematical, depending upon the representation of the shapes and the structure of the GSL and comprises the action of creating a set of tessellated shapes by removing a portion of an input shape, such as the shaped identified at 312 that overlaps one or more existing shape.

For example, an exemplary clipping operation may be a subtraction operation which subtracts an overlap area between the identified shape and the one or more existing shapes from the identified shape. In some embodiments, the GSL may be implemented in various computer readable storage media such as one or more disks, various forms of memories, or a combination of disk(s) and various tangible forms of memory. In some embodiments, the GSL may be implemented in any form of data structures such as one or more text files, ASCII codes, tables, relational or non-relational database tables, combination of any of the above, etc. In some embodiments, the MOLs may be similarly implemented in various computer readable storage media such as one or more disks, various forms of memories, or a combination of disk(s) and various tangible forms of memory and may comprise one or more text files, ASCII codes, tables, relational or non-relational database tables, combination of any of the above, etc. In some embodiments, an arrayed instance represents the placement or instantiation of a particular cellview master in an electronic circuit design in a grid arrangement with rows and/or columns such that each instance of the master is located adjacent to another.

In a single embodiment or in some embodiments of the methods or the systems for creating a hierarchical output for a Boolean operation which is operated upon an electronic design may further comprise the acts or hardware modules of tessellating the identified shape after the clipping process at 318 to form one or more tiles (320). In these embodiments, the methods or the systems may tessellate the post-Boolean operation shape (PBOS) of the identified shape into one or more tiles. In these embodiments, a tile represents a single tessellated shape.

At 322, the methods or the systems for creating a hierarchical output for a Boolean operation which is operated upon an electronic design may further comprise the act or module for applying the inverse transform to the one or more tiles (if 320 is performed) or the PBOS (if 320 is not performed) to transform the PBOS or the one or more tiles to their respective locations they would have if their master is placed at the origin.

At 324, the methods or the systems for creating a hierarchical output for a Boolean operation which is operated upon an electronic design may further comprise adding the one or more inversely transformed tiles or PBOS to one or more master output layers (MOL's). Where the one or more master output layers do not exist yet, the method or the system also creates the one or more master output layers in order to add the one or more inversely transformed tiles or PBOS.

In some embodiments, the criterion comprises a determination of whether or not there will be duplication in the master output layer due to the integration of the PBOS or the tiles. If integrating PBOS or the corresponding tiles into the master output layer results in duplication the method or the system may clip the PBOS or the corresponding tiles against one or more existing tiles or shapes in the master output layer to eliminate duplication in some embodiments. In these embodiments, the method or the system for generating a hierarchical output for an operation first examines the criterion such as determining whether there will be duplication by the integration of the PBOS before the method or the system performs the optional tessellation and integration into the master output layer to conserve system resources.

At 326, the methods or the systems may further comprise the act or module for determining whether there are more shapes to process at the hierarchical level in some embodiments.

If the methods or the systems determine that there exists at least one more shape to be processed the methods or the system loop back to 310 to identify a new shape and follows the same process as described above in 312-326 until all shapes are processed. If the methods or the systems determine that there exists no more shape to process the methods or the system then proceeds to 328 to determine whether the task calls for the processing of another level in the hierarchy. If the methods or the systems determine that there is no more level to be processed the methods or the systems proceed to 330 to continue to perform, for example, the task by using the hierarchical output. If the methods or the systems determine that there is at least one level to process the methods and systems loop back to 310 and repeat 312-326 in some embodiments.

Figure 4:
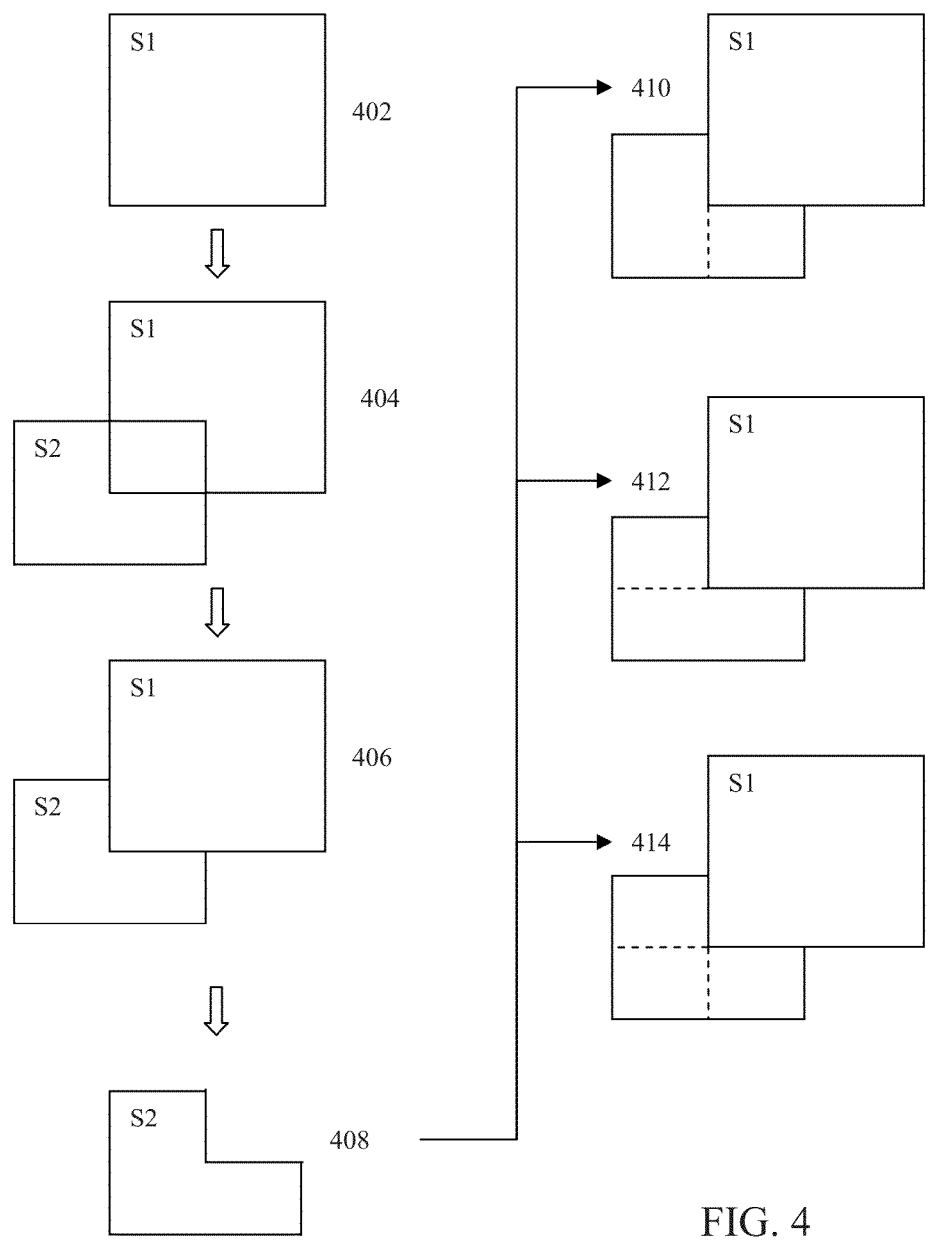
FIG. 4 illustrates an example for the methods or systems as described in FIG. 3.

Referring to FIG. 4 which illustrates an example of the operations of the methods or the systems as described with reference to FIGS. 2-3.

At 402, the methods or the systems identify the first shape (S1) and add S1 to the GSL (global scratch layer). At 404, the methods or the systems further identifies the second shape (S2) and add S2 to the GSL. For the shape S2, the shape S1 is considered as an existing shape because S1 has already existed in the GSL when the methods or the systems identify S2. It can be seen that S1 and S2 overlap. In other words, the central rectangular area is represented by both S1 and S2. At 406, the methods or the systems clip S2 against the existing shape S1. In this example, the area representing the overlapped area is subtracted or removed from S2.

This clipping process at 406 forms the PBOS (post-Boolean operation shape) as shown in 408. 410, 412, and 414 illustrate three different tessellation processes for tessellating the PBOS of S2. In 410, the PBOS is tessellated vertically to form two tiles. In 412, the PBOS is tessellated horizontally to form two different tiles. In 414, the PBOS is tessellated both vertically and horizontally to form three different tiles. It shall be noted that some of the three tiles may be identical depending on the dimensions of the PBOS. In the example, only rectangular tiles are shown for the ease of illustration and explanation. One of ordinary skill in the art shall recognize that different tessellation processes may be performed to tessellate the PBOS without deviating from the scope of various embodiments of the invention.

In a single embodiment or in some embodiments of the methods or the systems may determine one or more appropriate tessellation processes for a PBOS depending upon various criteria. For example, the methods or the systems may choose the tessellation process for a PBOS based on the tiles that have already been created for other PBOS's so as to minimize the number of tiles with different sizes in some embodiments. As another example, the methods or the systems may choose the tessellation process for a PBOS to avoid having tiles over or under certain dimensions in some embodiments. The methods or the systems then perform the inverse transform to the tiles add the tiles to the MOL (master output layer) to create an hierarchical output for the Boolean operation associated with the task that is or is to be performed on the electronic circuit design.

Figure 5A:
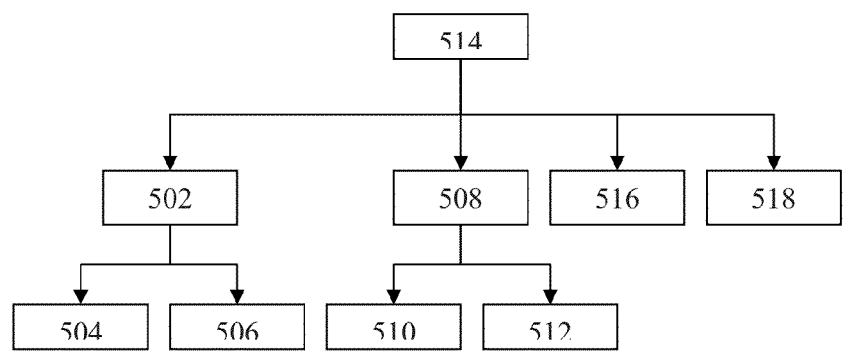
FIG. 5A illustrates a hierarchical structure of an exemplary electronic design for an example of the methods or systems as illustrated in FIGS. 1-4.
Figure 5B:
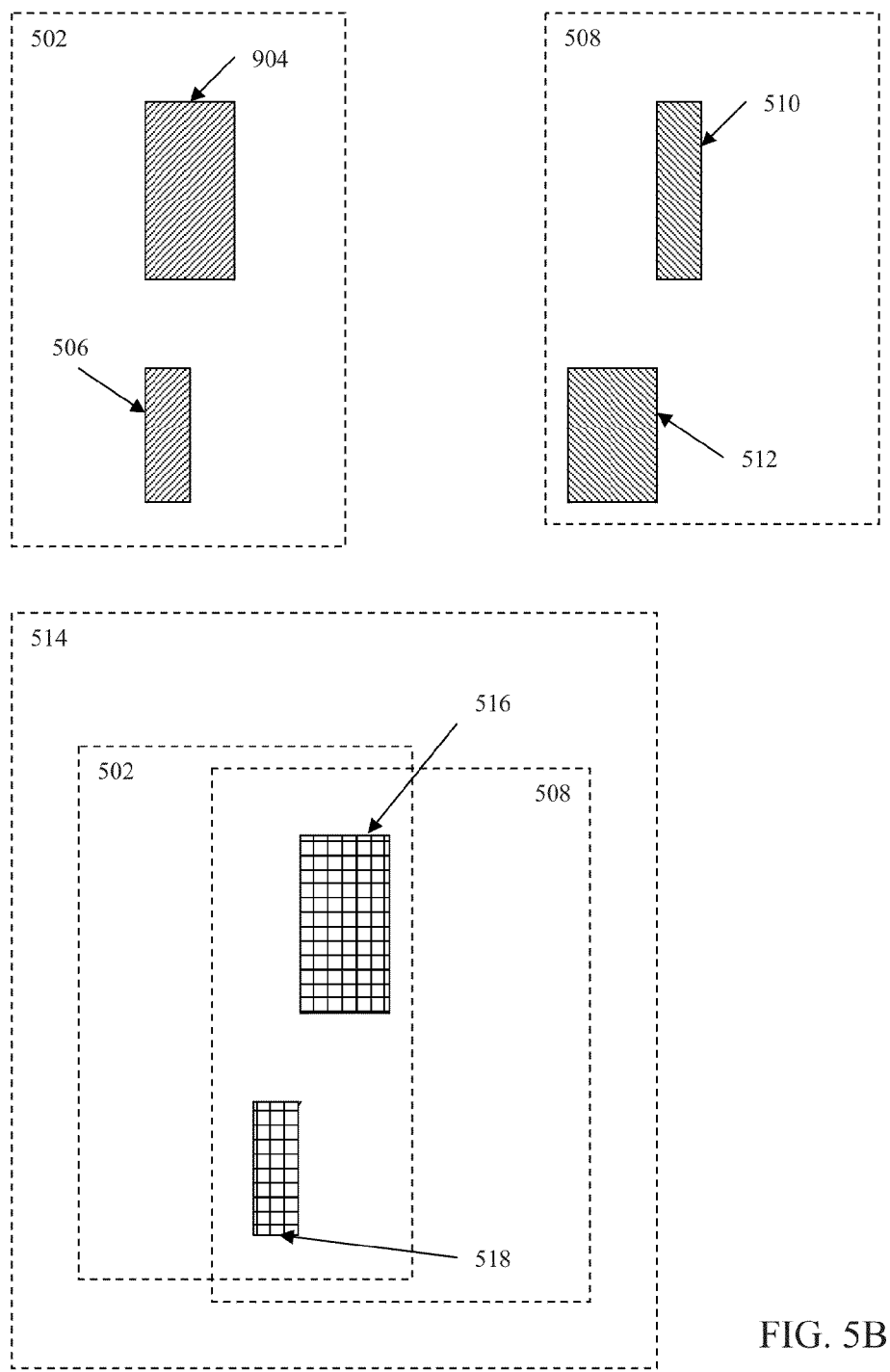
FIG. 5B illustrates exemplary views various cell instances of the electronic circuit design.

With reference to FIGS. 5A-C which illustrate a hierarchical structure of an exemplary electronic design for an example of the methods or systems as illustrated in FIGS. 1-4. FIGS. 5A-C illustrate a scenario where an electronic circuit design is undergoing a design rule check process which determines whether the shapes in the design conform with the design rule which requires that the width of a shape is not to exceed a MaxWidth constraint. For the ease of illustration and explanation, the electronic design in FIGS. 5A-C is hierarchical and comprises an instance of the cell master 514 at the lowest level of the hierarchy. Cell 514 comprises two shapes 516 and 518 and further comprises one instance of cell 502 and one instance of cell 508.

In this hierarchical structure of the electronic circuit design, cell instances 502 and 508 are at the next higher level of the hierarchy than the lowest hierarchical level at which cell instance 514 is located. Cell 502 comprises two shapes 504 and 506, and cell 508 comprises two shapes 510 and 512. In this example, the width of a shape is defined as the minimum dimension of a given rectangle, and the maximum width (the MaxWidth constraint) is defined to be the largest width allowed for a shape in the electronic circuit design. It is assumed that all the individual shapes 504, 506, 510, 512, 516, and 518 all meet the maximum width requirement as imposed by, for example, a design rule of interest in this example. It shall be further noted that the cell instance 514's representation only shows the two individual shapes 516 and 518 together with two rectangular regions in dashed lines representing the cell instance 502 and the cell instance 508 due to the hierarchical nature of the electronic design.

Although each individual shape satisfies the MaxWidth constraint of the design rule, the actual, combined sets of shapes (554 and 556 as illustrated in 552 of FIG. 5C with individual constituent shapes as illustrated in 550 of FIG. 5C) may nonetheless violate the MaxWidth constraint. The spatial relationships of individual shapes 504, 516, and 510, and between 506, 512, and 518 are illustrated in 550 of FIG. 5B. In order to determine whether the actual circuit component as represented by 554 and 556 in FIG. 5C, conventional approaches flatten the two levels in the hierarchy of the electronic circuit design to form one single hierarchy with all the individual shapes (504, 506, 510, 512, 516, and 518).

The conventional approaches then performs a logical disjunction among all the individual shapes to form shape 554, which comprises the individual shapes 504, 516, and 510, and shape 556, which comprises the individual shapes 506, 512, and 518, and subsequently performs DRC to determine whether the combined shapes 554 and 556 satisfy the MaxWidth constraint or design rule. The resulting output for the Boolean OR operation as required by the MaxWidth design rule for these conventional approaches is then a flat hierarchy which contains all the individual shapes among various, multiple hierarchical levels in the original hierarchy of the electronic design.

In contrast, some embodiments of the invention identify the operation, such as a Boolean OR operation, associated with the DRC, identify the requisite shapes from the related levels in the hierarchy, determine inverse transform(s) for the instance path(s) of cellview master(s) to which the identified, requisite shapes belong, process each of the identified, requisite shapes, tessellate the resulting shapes into tiles, apply the inverse transform(s) to the tiles, and adds the inversely transformed tiles to the master output layer(s) to create a hierarchical output for the Boolean OR operation associated with the MaxWidth DRC. In some embodiments, the methods or the systems perform the above processes to create a hierarchical output for the Boolean OR operation associated with DRC's without flattening the multi-level hierarchical structure of the electronic circuit design.

In the single embodiment or in some embodiments, the methods or the systems parallelize the acts as described above with reference to FIGS. 1-8. In some embodiments, the methods or the systems parallel the acts in a scalable multithreading parallel system. In these embodiments, the methods or the systems share the computing resources such as the computing units, the CPU caches, and the translation lookaside buffer to achieve faster overall execution of the acts by, for example, increasing utilization of a processor core by leveraging thread-level and instruction-level parallelism.

In the single embodiment or in some embodiments, the methods or the systems parallel the act for performing one or more tasks, such as one or more dummy fill insertion tasks and/or one or more design rule checking tasks, in a multi-threading system using the hierarchical output for a Boolean operation which is or is to be operated upon an electronic design for the performance of a task on the electronic circuit. Due to variations in thread granularity and the usually slower frequencies and/or additional pipeline stages that are necessary to accommodate thread-switching architecture, the methods or the systems may group the total threads into one or more groups of thread subsets, each of which may then be load-balanced independently in the single embodiment or in some embodiments. The methods or the systems may further establish a load-balancing policy for each thread subset based at least in part upon the characteristics of the thread subset and the task(s) sent to the threads within the subset.

In these embodiments, the methods or the systems divide the master region of the hierarchical electronic circuit into a plurality of uniform or non-uniform portions or regions and distribute at least one of the plurality of portions or regions of the electronic circuit design to a thread of a processor. Any manner of dividing the hierarchical design can be utilized to divide the design. In some embodiments, the methods or the systems divide the master region of the electronic circuit design into a plurality of uniform or non-uniform portions or regions according to one or more routing directions in the master region of the electronic circuit design.

For example, in a first sub-region of the master region where the routing direction is running vertically, the methods or the systems may then divide the master region vertically to create a vertical slice or sub-region for the first sub-region. If the routing direction of a second sub-region adjacent to the first sub-region is running horizontally, the methods or the systems may then divide the master region to create a horizontal sub-region for the second sub-region. In other words, the method or the system may divide the master region in a direction along the routing direction. In some embodiments, the method or the system may also divide the master region in a direction that is perpendicular to the routing direction or may divide the master region into a plurality of polygonal regions of varying sizes. For example, the method or the system may divide the master region into a plurality of rectangular or other polygonal sub-regions of a uniform size or of varying sizes. In various embodiments, the method or the system may divide the master region in any manner while still performing its intended purposes. The above examples of dividing the master region into sub-regions are presented for illustrative and explanatory purposes and do not intend to and should not be interpreted to limit the scope of various embodiments of the invention or the claims.

In some embodiments, the methods or the systems divide the master region or the design area of the electronic circuit design. For example, the methods or the systems may simply divide the design area or the master region into uniform or non-uniform horizontal or vertical slices by the number of available threads. In some embodiments, the methods or the systems may divide the design area into uniform or non-uniform grids with horizontal and vertical sub-regions. In some embodiments, the methods or the systems divide the design area under consideration without taking into account the block boundaries, gates, or functionality of any sub-regions or components because the methods or the systems produce or have the capability to produce the shapes of one or more Boolean operations at any given level or levels of the hierarchy of the master region of the electronic circuit design even if the division crosses the boundaries of a subcell.

Figure 7A:
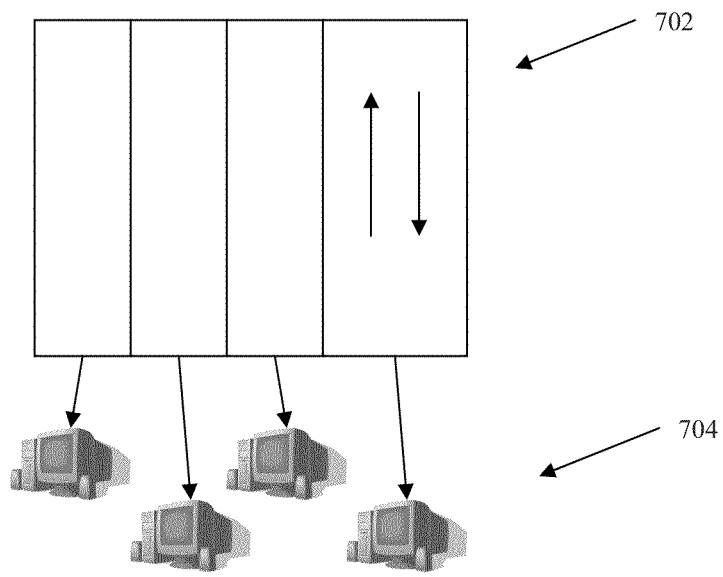
FIG. 7A illustrates an exemplary way of dividing an electronic circuit design or a portion thereof in accordance with a vertical routing direction.

With reference to FIG. 7A which illustrates an exemplary way of dividing an electronic circuit design or a portion thereof in accordance with a vertical routing direction, the electronic circuit design or a portion thereof 702 in this example is divided into four sub-regions and then passed to four slaves 704 for processing in accordance with the processes as described in the preceding paragraphs. It shall be noted that FIG. 7A shows the use of four slaves or one master computing node together with three slaves for illustration and explanation purposes. Nonetheless, more than one sub-region may be passed to a processing node (such as the master computing node or a slave) for further processing. Therefore, the actual number of processing nodes used for further processing may be determined based on one or more factors such as load balancing, performance criteria, etc.

In some embodiments, the routing direction represents a global routing direction or a global preferred routing direction for the electronic circuit design or a portion thereof. In other embodiments, the routing direction represents a local preferred routing direction or a local routing direction for a particular portion or region of the electronic circuit design. In some embodiments, the local preferred routing direction or the local routing direction is different from the global routing direction or the global preferred routing direction. Other embodiments allow the local routing direction or the local preferred routing direction to be the same as the global routing direction or the global preferred routing direction. In various embodiments, the local preferred routing direction may be defined to increase routing capacity of a particular region to which the local preferred routing direction applies. For example, for a region A that is adjacent to two other regions in which the respective routing directions run in the horizontal and vertical direction, the local routing direction or the local preferred routing direction may be defined to be in an oblique direction such that the routes or tracks may be joined in a more space efficient manner to increase the routing capacity of region A.

In some embodiments, the division of the master region of interest or the hierarchical electronic circuit design is performed along the boundaries of various cells in the area of interest.

In other embodiments, the division of the master region of interest or the hierarchical electronic circuit design into a plurality of sub-regions need not be performed along the boundaries of the cells. In the latter embodiments, the boundaries of the one or more sub-regions need not coincide with the boundaries of certain cells. In other words, the boundaries of the one or more sub-regions may cross the boundaries of some cells.

In various embodiments, the size, composition, or location of the division, the manner of division, or user's preference goals may be determined to meet certain performance criteria. For example, the method or the system may determine to divide the area of interest in the electronic circuit design into more sub-regions if the user desires to complete the processing within a shorter time frame. In this example, the size, composition, or the locations of various sub-regions may be adjusted or determined accordingly to meet the user's performance goals.

Figure 7B:
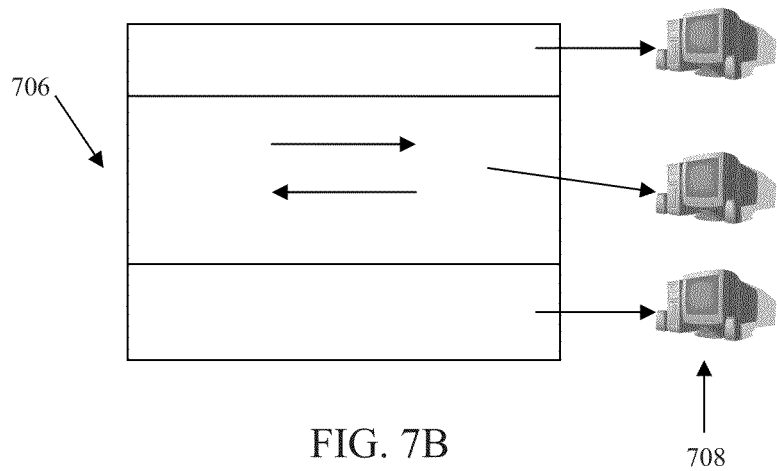
FIG. 7B illustrates an exemplary way of dividing an electronic circuit design or a portion thereof in accordance with a horizontal routing direction.

With reference to FIG. 7B which illustrates an exemplary way of dividing an electronic circuit design or a portion thereof in accordance with a horizontal routing direction, the electronic circuit design or a portion thereof 706 in this example is divided into three sub-regions and then passed to three slaves 708 for further processing in accordance with the processes as described in the preceding paragraphs. It shall be noted that FIG. 7B shows the use of three slaves or one master computing node together with two slaves for illustration and explanation purposes. Nonetheless, more than one sub-region may be passed to a processing node (such as the master computing node or a slave) for further processing. Therefore, the actual number of processing nodes used for further processing may be determined based on one or more factors such as load balancing, performance criteria, etc.

Figure 7C:
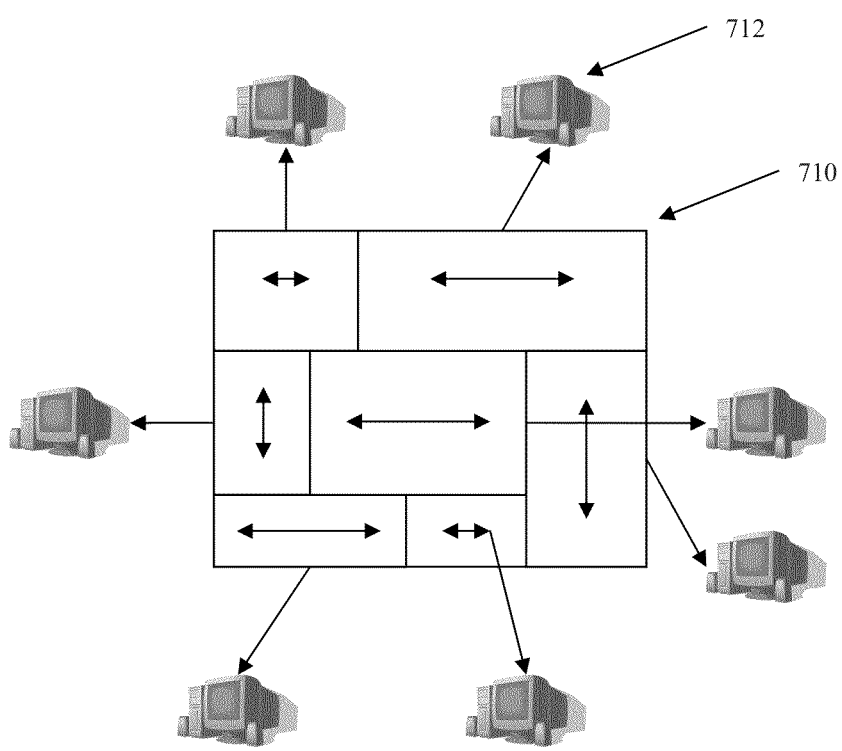
FIG. 7C illustrates an exemplary way of dividing an electronic circuit design or a portion thereof in accordance with both vertical and horizontal routing directions.

With reference to FIG. 7C which illustrates an exemplary way of dividing an electronic circuit design or a portion thereof in accordance with both vertical and horizontal routing directions, the electronic circuit design or a portion thereof 710 is divided into seven sub-regions and passed to seven slaves or one master computing node plus six slaves for further processing in accordance with the processes as described in the preceding paragraphs. It shall be noted that FIG. 7C shows the use of seven slaves or one master computing node together with six slaves for illustration and explanation purposes. Nonetheless, more than one sub-region may be passed to a processing node (such as the master computing node or a slave) for further processing. Therefore, the actual number of processing nodes used for further processing may be determined based on one or more factors such as load balancing, performance criteria, etc.

It shall be further noted that FIGS. 7A-C illustrate the use of Manhattan directions as the routing directions. Nonetheless, the routing directions are not limited to Manhattan directions, and oblique routing directions may also be used.

Once the methods or the systems divide the master region into slices or grids, the methods or the systems may send at least one slice or one grid to each slave or each thread. In some embodiments, there exist no overlapping sub-regions in the slices or grids of the master region that are sent to each thread or each slave to avoid performing the same or similar tasks for the overlapping area more than once. For each thread or each slave, the methods or the systems send the slice(s) or grid(s) that the thread or the slave processes in some embodiments.

The methods or the systems further send the number of levels associated with the task(s) to be performed on the electronic design to each thread or each slave in some embodiments. The methods or the systems may also send a pointer to the master design to each slave or each thread, which has read access to the entire design to produce shapes as required by the task to process or its associated Boolean or other operations. Each thread or slave then writes the output locally in the divided sub-region(s) or slice(s) or grid(s) in some embodiments. When the slave is done and it needs to incorporate its data into the master, the master data is locked at the cellview level while the data is transferred in some embodiments, and therefore multiple slaves or threads may write their respective results to the master simultaneously as long as each slave or each thread is writing the results for different cellviews.

In some embodiments, the methods or the systems parallelize the processing of the acts or modules in a scalable multiprocessing such as a single- or multiple-processor system where each processor has multithreading capabilities. In some embodiments, the methods or the systems parallel the acts by utilizing a multiprocessing computing system with multithreading capabilities. For example, the multiprocessing computing system may comprise one or more multi-threading central processing units (CPUs) each of which comprises one or more processing cores. In these embodiments where the methods or the systems parallelize the processing of the acts or the modules where all processors have access to a shared memory such as the CPU caches and some lookaside buffers. In some embodiments, the methods or the systems parallelize the processing of the acts or modules using the thread-level parallelism, the instruction-level parallelism, or a combination thereof.

In some embodiments, the methods or the systems distribute the processing of the acts or the modules in a distributed computing environment in which the methods or the systems utilize a distributed computing system which comprises multiple autonomous computers that communicate and interact with each other through a computer network by, for example, exchanging messages between the computers, to achieve common goals. In some embodiments, at least one of the autonomous computers has the multithreading capability. In these embodiments where the methods or the systems distribute the processing of the acts or the modules in a distributed computing environment by utilizing multiple autonomous computers, each of the multiple autonomous computers has its own private memory, which is jointly called a distributed memory.

Figure 6:
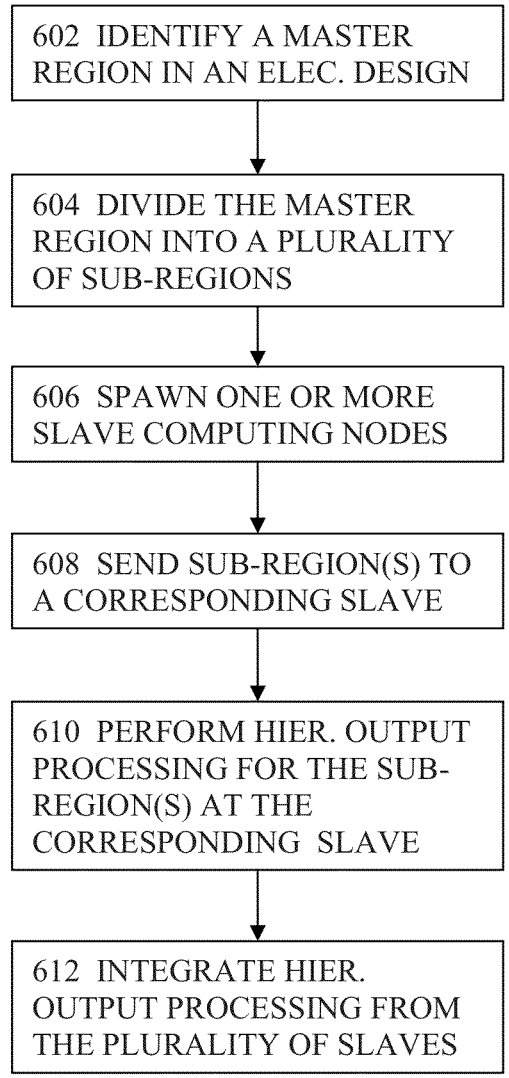
FIG. 6 illustrates a top level diagram for a parallelization architecture that may be used to implement various processes as described in the Application.

With reference to FIG. 6 which illustrates a top level diagram for the methods and systems for generating a hierarchical output for an operation which is or is to be operated upon an electronic design for the performance of a task on the electronic circuit comprises identifying a master region in the hierarchical electronic circuit design 602. In these embodiments, the master region may be a portion less then the whole electronic circuit design or may be the entire electronic circuit design.

At 604, the method or the system for generating a hierarchical output for an operation further comprises dividing the master region into a plurality of sub-regions. At 606, the method or the system for generating a hierarchical output for an operation further comprises spawning or initiating one or more slave computing nodes.

In some embodiments, the system comprises a master computing node and one or more computing nodes. In the embodiments where the system comprises a master computing node and one or more slave computing nodes, the master computing node is responsible for dividing the hierarchical electronic circuit design or a portion (such as a master region or a region of interest) into a plurality of sub-regions. The master computing node also spawns and initiates the one or more slave computing nodes 104. More details of dividing the electronic circuit design or a portion thereof are described in greater details in the following paragraphs.

In some embodiments, the system comprises a scalable multithreading parallel system with one or more central processing units (CPUs) where multiple threads share the computing resources such as the computing units, the CPU caches, and the translation lookaside buffer to achieve faster overall execution of the acts by, for example, increasing utilization of a processor core by leveraging thread-level and instruction-level parallelism. In these embodiments, the CPUs may comprise one or more processor cores, and at least one of the process cores is capable of multi-thread computation. In other embodiments, the system may comprise a single computing system with one or more central processing unit (CPU) each of which comprises one or more processing cores, at least one of which is capable of multi-thread computation.

At 608, the method or the system for generating a hierarchical output for an operation comprises sending one or more sub-regions to at least one of the one or more slave computing nodes, at least one of the one or more processing cores, or at least one or more threads (hereinafter one or more slaves collectively) for further performing the processes as illustrated in FIGS. 1-3 and the respective description in the preceding paragraphs.

At 610, the method or the system for generating a hierarchical output for an operation comprises performing hierarchical output processing on the one or more sub-regions at the at least one of the one or more slaves. More details of performing the hierarchical output processing one the one or more sub-regions will be described in greater details in the preceding paragraphs with reference to FIGS. 1-3. At 612, the method or the system for generating a hierarchical output for an operation comprises integrating the results of the hierarchical output processing generated by the at least one of the one or more slaves.

System Architecture Overview

FIG. 8 illustrates a block diagram of an illustrative computing system 1400 suitable for implementing various embodiments of the invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment of the invention, computer system 1400 performs specific operations by one or more processors or processor cores 1407 executing one or more sequences of one or more instructions contained in system memory 1408. Such instructions may be read into system memory 1408 from another computer readable/usable storage medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention. In the single embodiment or in some embodiments, the one or more processors or processor cores 1407 may be used to perform various acts in FIGS. 1, 3, 5A-B, and 6A-B such as various acts involving determining, identifying, tessellating, applying, populating, adding, creating, etc. In some embodiments, at least one of the one or more processors or processor cores 1407 has the multithreading capability.

The term "computer readable storage medium" or "computer usable storage medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable storage media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read. For example, the various forms of computer readable storage media may be used by the methods or the systems to store either temporarily or permanently information or data such as the one or more master regions, one or more master output layers, one or more global scratch layers, various transforms and inverse transforms, shapes, etc.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals that include data streams representing various types of signal information, e.g., instructions, messages and data. In embodiments of the invention, the functions of the data interface 1433 may be performed by the communication interface 1414.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for processing a hierarchical electronic circuit design, the method comprising:

using a computer system which comprises at least one processor to perform a processes, the process comprising:

identifying one or more logical operations that are associated with a task and involves at least one logical operator, wherein the task is to be performed on the hierarchical electronic circuit design, which comprises a hierarchy including a first level and a second level; and generating a hierarchical output, rather than a flattened output, for a plurality of shapes in the hierarchical electronic circuit design for a result of performing the task on at least some shapes of the plurality of shapes in the hierarchical electronic circuit design based at least in part upon performing the one or more logical operations associated with the task on the at least some shapes on multiple hierarchical levels to determine a derivative shape having a different geometry from the at least some shapes, without flattening the multiple hierarchical levels concerning the at least some shapes in the hierarchical electronic circuit design, wherein the act of generating the hierarchical output comprises:

reducing one or more overlapping geometries by at least operating on a subsequently added shape with one or more previously added shapes.

2. The computer implemented method of claim 1, wherein the at least one processor executes a plurality of threads to perform the act of generating the hierarchical output in parallel.

3. The computer implemented method of claim 1, further comprising:
   identifying a master region in the hierarchical electronic circuit design as an input region for the computer implemented method.

4. The computer implemented method of claim 3, wherein the master region represents a portion of the electronic circuit design.

5. The computer implemented method of claim 1, wherein the task is performed on a plurality of layers in a stack of films of an electronic circuit design.

6. The computer implemented method of claim 1, wherein the task comprises a dummy fill insertion task or a design verification task.

7. The computer implemented method of claim 1, further comprising:
   identifying a shape in a cellview master for the electronic circuit design in a first level in the hierarchy; and
   creating a master output layer for the cellview master for storing the hierarchical output.

8. The computer implemented method of claim 7, further comprising:
   determining an inverse transform for an instance path of an instance of the cellview master to which the shape belongs.

9. The computer implemented method of claim 8, further comprising:
   applying the inverse transform to a derived shape or a tile of the shape to a location that the derived shape or the tile will have if the cellview master is placed at an origin; and
   adding the derived shape or the tile that is inversely transformed to a master output layer for the hierarchical output.

10. The computer implemented method of claim 1, further comprising:
    performing at least one of the one or more operations on a shape to generate a post-operation shape.

11. The computer implemented method of claim 10, further comprising:
    tessellating the post-operation shape into one or more tiles.

12. The computer implemented method of claim 1, wherein the act of generating the hierarchical output comprises:
    clipping a subsequently added shape against one or more previously added shapes in a scratch layer to reduce one or more overlapping geometries in the scratch layer.

13. The computer implemented method of claim 12, wherein the act of clipping comprises removing an overlapping area between the subsequently added shape and the one or more previously added shapes.

14. The computer implemented method of claim 1, further comprises:
    repeating the process for one or more shapes on a second level in the hierarchy, wherein the plurality of shapes belong to a first level in the hierarchy.

15. The computer implemented method of claim 1, wherein the one or more operations comprises a logical disjunction operation for multiple shapes in the hierarchical electronic circuit design.

16. A apparatus for processing a hierarchical electronic circuit design, the system comprising:
    a computer system which comprises at least one processor and is to:
       identify one or more logical operations associated with the task and involves at least one logical operator, wherein the task is to be performed on the hierarchical electronic circuit design which comprises a hierarchy including a first level and a second level; and
    generate a hierarchical output, rather than a flattened output, for a plurality of shapes in the hierarchical electronic circuit design for a result of performing the task on at least some shapes of the plurality of shapes in the hierarchical electronic circuit design based at least in part upon performing the one or more operations associated with the task on the at least some shapes on multiple hierarchical levels to determine a derivative shape having a different geometry from the at least some shapes, without flattening the multiple hierarchical levels concerning the at least some shapes in the hierarchical electronic circuit design, wherein the act of generating the hierarchical output comprises:
       reducing one or more overlapping geometries by at least operating on a subsequently added shape with one or more previously added shapes.

17. The apparatus of claim 16, wherein the computer system is further programmed for performing:
    identifying a master region in the hierarchical electronic circuit design as an input region.

18. The apparatus of claim 16, wherein the computer system is further programmed for performing:
    identifying a shape in a cellview master for the electronic circuit design in a first level in the hierarchy; and
    creating a master output layer for the cellview master for storing the hierarchical output.

19. The apparatus of claim 18, wherein the computer system is further programmed for performing:
    determining an inverse transform for an instance path of an instance of the cellview master to which the shape belongs; and
    applying the inverse transform to a derived shape or a tile of the shape to a location that the derived shape or the tile will have if the cellview master is placed at an origin; and
    adding the derived shape or the tile that is inversely transformed to a master output layer for the hierarchical output.

20. The apparatus of claim 16, wherein the computer system is further programmed for performing:
    performing at least one of the one or more operations on a shape to generate a post-operation shape; and
    tessellating the post-operation shape into one or more tiles.

21. The apparatus of claim 16, wherein the computer system that is programmed for performing the act of generating the hierarchical output is further programmed for performing:
    clipping a subsequently added shape against one or more previously added shapes in a scratch layer to reduce one or more overlapping geometries in the scratch layer.

22. The apparatus of claim 16, wherein the computer system executes a plurality of threads to perform the act of generating the hierarchical output in parallel.

23. An article of manufacture of a computer program product comprising a non-transitory computer readable storage medium having a sequence of instructions which, when executed by a computer system, cause one or more processors, processor cores, or combination thereof to execute a method for processing a hierarchical electronic circuit design, the method comprising:
    using the computer system which comprises at least one processor or a processor core and is to perform a process, the process comprising:

identifying one or more logical operations that are associated with the task and involves at least one logical operator, wherein
 the task is to be performed on the hierarchical electronic circuit design which comprises a hierarchy including a first level and a second level; and
generating a hierarchical output, rather than a flattened output, for a plurality of shapes in the hierarchical electronic circuit design for a result of performing the task on at least some shapes of the plurality of shapes in the hierarchical electronic circuit design based at least in part upon performing the one or more operations associated with the task on the at least some shapes on multiple hierarchical levels to determine a derivative shape having a different geometry from the at least some shapes, without flattening the multiple hierarchical levels concerning the at least some shapes in the hierarchical electronic circuit design, wherein the act of generating the hierarchical output comprises:
 reducing one or more overlapping geometries by at least operating on a subsequently added shape with one or more previously added shapes.

24. The computer program product of claim 23, wherein the process further comprises:
 identifying a master region in the hierarchical electronic circuit design as an input region.

25. The computer program product of claim 23, wherein the process further comprises:
 identifying a shape in a cellview master for the electronic circuit design in a first level in the hierarchy; and
 creating a master output layer for the cellview master for storing the hierarchical output.

26. The computer program product of claim 25, wherein the process further comprises:
 determining an inverse transform for an instance path of an instance of the cellview master to which the shape belongs;
 applying the inverse transform to a derived shape or a tile of the shape to a location that the derived shape or the tile will have if the cellview instance is placed at an origin; and
 adding the derived shape or the tile that is inversely transformed to the master output layer.

27. The computer program product of claim 23, wherein the process further comprises:
 performing at least one of the one or more operations on a shape to generate a post-operation shape; and
 tessellating the post-operation shape into one or more tiles.

28. The computer program product of claim 23, wherein the act of generating the hierarchical output comprises:
 clipping a subsequently added shape against one or more previously added shapes in a scratch layer to reduce one or more overlapping geometries in the scratch layer.

29. The computer program product of claim 23, wherein the at least one processor executes a plurality of threads to perform the act of generating the hierarchical output in parallel.

* * * * *